United States Patent
Sugano et al.

(10) Patent No.: US 10,155,835 B2
(45) Date of Patent: *Dec. 18, 2018

(54) CYANATE ESTER COMPOUND AND METHOD FOR PRODUCING THE SAME, AND CURABLE RESIN COMPOSITION COMPRISING THE COMPOUND, AND CURED PRODUCT THEREOF COMPOSITION

(75) Inventors: Yuuichi Sugano, Niigata (JP); Masayuki Katagiri, Niigata (JP); Seiji Kita, Kurashiki (JP); Daisuke Ohno, Chiyoda-ku (JP); Masanobu Sogame, Katsushika-ku (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 1313 days.

This patent is subject to a terminal disclaimer.

(21) Appl. No.: 14/237,426

(22) PCT Filed: Jul. 31, 2012

(86) PCT No.: PCT/JP2012/069500
§ 371 (c)(1),
(2), (4) Date: Jun. 13, 2014

(87) PCT Pub. No.: WO2013/021869
PCT Pub. Date: Feb. 4, 2013

(65) Prior Publication Data
US 2014/0308530 A1   Oct. 16, 2014

(30) Foreign Application Priority Data
Aug. 9, 2011   (JP) .................................. 2011-174070

(51) Int. Cl.
| | |
|---|---|
| *B32B 5/02* | (2006.01) |
| *B32B 7/12* | (2006.01) |
| *C08J 5/24* | (2006.01) |
| *C09K 3/10* | (2006.01) |
| *B32B 15/14* | (2006.01) |
| *C08G 10/04* | (2006.01) |
| *C08G 14/12* | (2006.01) |
| *C08G 73/06* | (2006.01) |
| *C08L 61/18* | (2006.01) |
| *C08L 61/34* | (2006.01) |
| *C08L 63/00* | (2006.01) |
| *C08L 71/00* | (2006.01) |
| *C08L 79/04* | (2006.01) |
| *B32B 15/098* | (2006.01) |
| *C09J 161/18* | (2006.01) |
| *C09J 161/34* | (2006.01) |
| *C09J 179/04* | (2006.01) |
| *H01L 23/29* | (2006.01) |

(52) U.S. Cl.
CPC ............ *C08G 10/04* (2013.01); *B32B 5/022* (2013.01); *B32B 5/024* (2013.01); *B32B 7/12* (2013.01); *B32B 15/098* (2013.01); *B32B 15/14* (2013.01); *C08G 14/12* (2013.01); *C08G 73/0655* (2013.01); *C08J 5/24* (2013.01); *C08L 61/18* (2013.01); *C08L 61/34* (2013.01); *C08L 63/00* (2013.01); *C08L 71/00* (2013.01); *C08L 79/04* (2013.01); *C09J 161/18* (2013.01); *C09J 161/34* (2013.01); *C09J 179/04* (2013.01); *C09K 3/1006* (2013.01); *B32B 2250/40* (2013.01); *B32B 2260/023* (2013.01); *B32B 2260/046* (2013.01); *B32B 2262/0261* (2013.01); *B32B 2262/0269* (2013.01); *B32B 2262/0276* (2013.01); *B32B 2262/101* (2013.01); *B32B 2307/3065* (2013.01); *C08J 2361/34* (2013.01); *H01L 23/29* (2013.01); *H01L 2924/0002* (2013.01); *Y10T 428/31688* (2015.04)

(58) Field of Classification Search
None
See application file for complete search history.

(56) References Cited

U.S. PATENT DOCUMENTS

| | | | |
|---|---|---|---|
| 3,562,214 | A | 2/1971 | Rolf et al. |
| 4,631,319 | A | 12/1986 | Blahak et al. |
| 4,745,215 | A | 5/1988 | Cox et al. |
| 4,831,086 | A | 5/1989 | Das et al. |
| 4,904,760 | A | 2/1990 | Gaku et al. |
| 4,978,727 | A | 12/1990 | Das et al. |

(Continued)

FOREIGN PATENT DOCUMENTS

| | | |
|---|---|---|
| CN | 101128501 | 2/2008 |
| CN | 101735108 | 6/2010 |

(Continued)

OTHER PUBLICATIONS

International Search Report in PCT/JP2012/069500 dated Nov. 6, 2012 in English.

(Continued)

*Primary Examiner* — Alicia Chevalier
*Assistant Examiner* — Elaine M Vazquez
(74) *Attorney, Agent, or Firm* — Greenblum & Bernstein, P.L.C.

(57) ABSTRACT

To provide a novel cyanate ester compound that can realize a cured product having low dielectric constant and dielectric loss tangent, and excellent flame retardancy and heat resistance, and moreover has relatively low viscosity, excellent solvent solubility, and also excellent handling properties, and a method for producing the cyanate ester compound, and a curable resin composition and the like using the cyanate ester compound. A phenol-modified xylene formaldehyde resin is cyanated.

14 Claims, No Drawings

(56) References Cited

U.S. PATENT DOCUMENTS

| | | | |
|---|---|---|---|
| 5,194,331 A | 3/1993 | Das et al. | |
| 5,360,887 A | 11/1994 | Tsunemi et al. | |
| 5,468,790 A | 11/1995 | Papathomas | |
| 6,931,050 B1 | 8/2005 | Bottomley | |
| 2003/0130412 A1 | 7/2003 | Mizuno et al. | |
| 2005/0182203 A1 | 8/2005 | Sugano et al. | |
| 2006/0084787 A1 | 4/2006 | Sugano et al. | |
| 2006/0167189 A1 | 7/2006 | Mizuno et al. | |
| 2009/0017316 A1 | 1/2009 | Kato et al. | |
| 2011/0194261 A1 | 8/2011 | Tanaka et al. | |
| 2012/0009836 A1 | 1/2012 | Ueno et al. | |
| 2013/0281640 A1 | 10/2013 | Tsubuku et al. | |
| 2014/0308530 A1 | 10/2014 | Sugano et al. | |
| 2014/0329066 A1 | 11/2014 | Saito et al. | |

FOREIGN PATENT DOCUMENTS

| | | |
|---|---|---|
| CN | 101948408 | 1/2011 |
| EP | 0 324 908 | 7/1989 |
| EP | 1852451 | 11/2007 |
| EP | 2 055 728 | 5/2009 |
| JP | 52154857 | 12/1977 |
| JP | 63-250359 | 10/1988 |
| JP | 1-158039 | 6/1989 |
| JP | 2-214763 | 8/1990 |
| JP | 2-286723 | 11/1990 |
| JP | 4-24370 | 4/1992 |
| JP | 4-507110 | 12/1992 |
| JP | 05-222148 | 8/1993 |
| JP | 6-49238 | 2/1994 |
| JP | 6-122763 | 5/1994 |
| JP | 6-228308 | 8/1994 |
| JP | 7-207022 | 8/1995 |
| JP | 09-052941 | 2/1997 |
| JP | 11-124433 | 5/1999 |
| JP | 2000-95938 | 4/2000 |
| JP | 2000-191776 | 7/2000 |
| JP | 2001-339130 | 12/2001 |
| JP | 2002-206048 | 7/2002 |
| JP | 2002-531989 | 9/2002 |
| JP | 2003-128753 | 5/2003 |
| JP | 2003-128784 | 5/2003 |
| JP | 2003-128928 | 5/2003 |
| JP | 2004-175925 | 6/2004 |
| JP | 2004-182850 | 7/2004 |
| JP | 2005-264154 | 9/2005 |
| JP | 2007-009217 | 1/2007 |
| JP | 2009-35728 | 2/2009 |
| JP | 2009-161769 | 7/2009 |
| JP | 2010-174242 | 8/2010 |
| JP | 2011-178992 | 9/2011 |
| JP | 2013-084819 | 4/2015 |
| WO | 1990-0001514 | 2/1990 |
| WO | 2004-029127 | 4/2004 |
| WO | 2010/098037 | 9/2010 |
| WO | 2012/057144 | 5/2012 |

OTHER PUBLICATIONS

Database WPI Week 197806, Thomson Scientific, London BG; AN 1978-11136A, XP002733686A, & JP S52 154857 (Mitsubishi Gas Chem. Ind. Co., Ltd.) Dec. 22, 1977, Abstract.

CYANATE ESTER COMPOUND AND METHOD FOR PRODUCING THE SAME, AND CURABLE RESIN COMPOSITION COMPRISING THE COMPOUND, AND CURED PRODUCT THEREOF COMPOSITION

TECHNICAL FIELD

The present invention relates to a novel cyanate ester compound and a method for producing the same, and a curable resin composition comprising the compound, and a cured product thereof.

BACKGROUND ART

Cyanate ester compounds form triazine rings by curing, and because of their high heat resistance and excellent electrical characteristics, cyanate ester compounds have been conventionally widely used as raw materials of various functional polymer materials, such as structural composite materials, adhesives, electrical insulating materials, and electrical and electronic components. However, in recent years, with an advance in required performance in these application fields, various properties required of functional polymer materials have become increasingly strict. Examples of such properties include flame retardancy, heat resistance, a low dielectric constant, a low dielectric loss tangent, weather resistance, chemical resistance, low water absorbency, and high fracture toughness. However, these required properties have not always been satisfied so far.

For example, in the field of printed wiring board materials, with a higher communication frequency and clock frequency, a lower dielectric constant and dielectric loss tangent have been required. Therefore, in recent years, cyanate resins having excellent dielectric characteristics have been widely used.

In addition, from the viewpoint of ensuring safety against fire, bromine compounds having high flame retardancy are used in order to provide flame retardancy. As such bromine compounds, for example, brominated bisphenol A (see Patent Literature 1), a glycidyl ether of brominated phenol novolac (see Patent Literature 2), brominated maleimides (see Patent Literature 3), monofunctional cyanate ester compounds having bromine (see Patent Literature 4), and addition bromine compounds having no reactivity with cyanate ester compounds (see Patent Literature 5) are known.

However, although these bromine compounds have high flame retardancy, there is a possibility that they can not only form corrosive bromine or hydrogen bromide by pyrolysis, but form bromine compounds having strong toxicity associated with the dioxin problem in recent years, when decomposing in the presence of oxygen. Therefore, materials not containing these bromine-based flame retardants are required.

Therefore, as flame retardants replacing bromine, phosphorus-containing compounds, and nitrogen or sulfur-containing compounds are studied. For example, as phosphorus-containing compounds that are often blended in epoxy resins, triphenyl phosphate, resorcinol bis(diphenyl phosphate), and the like are known.

However, when large amounts of these phosphorus-containing compounds are blended in resin compositions, the heat resistance, moisture resistance, water absorbency, and the like of the resin compositions are often deteriorated. In order to improve this, using phosphorus-containing compounds having a phenolic hydroxyl group in combination with divalent cyanate ester compounds is also studied (for example, see Patent Literature 6, Patent Literature 7, and Patent Literature 8). But, for use of phosphorus-containing compounds, the problem of toxicity is concerned as for the above bromine compounds. Moreover, phosphorus-containing compounds are often difficult to landfill, and generation of a phosphine gas during combustion is also concerned. In addition, as nitrogen-containing compounds, melamine, guanidine, and the like are known, but the flame retardancy is insufficient when they are used alone.

On the other hand, as other components that provide flame retardancy to resin compositions, metal hydroxides, such as aluminum hydroxide and magnesium hydroxide, are known. However, blending of metal hydroxides may cause a deterioration in the dielectric characteristics, heat resistance, impact resistance, and moldability of resin compositions. In addition, for example, attempts are also made to use large amounts of inorganic fillers, such as spherical fused silica, as used in epoxy resins to decrease combustible components, thereby ensuring flame retardancy. However, there are fears that highly blending inorganic fillers increases the melt viscosity of resin compositions, causes a deterioration in moldability, and a deterioration in adhesion due to a deterioration in wettability on a substrate, and further, worsens dielectric characteristics, and the like. In addition, there are also attempts to use antimony-based flame retardants, such as antimony trioxide, in combination with brominated epoxy resins. However, the antimony-based flame retardants are generally toxic substances, and therefore, there is a fear of chronic toxicity.

From the viewpoints as described above, an improvement in the flame retardancy of functional polymer materials themselves blended in resin compositions is required more than ever.

In addition, in order to improve heat resistance, a low dielectric constant, a low dielectric loss tangent, weather resistance, chemical resistance, low water absorbency, high fracture toughness, moldability, adhesiveness, and the like simultaneously with flame retardancy, many attempts have been made so far. For example, a method for making a cured product having excellent thermal stability by combining a monofunctional cyanate ester compound with a bifunctional cyanate ester compound (see Patent Literature 9), and a method for promoting a lower dielectric constant and a lower dielectric loss tangent by combining a monofunctional cyanate ester compound with a polyfunctional cyanate ester compound (see Patent Literature 10) are known.

In addition, a method for producing a flame-retardant cyanate curing resin composition having low moisture absorbency, while promoting a lower dielectric constant and a lower dielectric loss tangent, by adding a monofunctional cyanate ester compound containing a halogen is known (see Patent Literature 4). This Patent Literature 4 describes various cyanate ester compounds, but use of an aromatic monofunctional cyanate ester compound having bromine as a functional group is essential for maintaining flame retardancy, and improving flame retardancy without using bromine is not successful.

Further, Patent Literature 11 describes a method for promoting flame retardancy using an aromatic cyanate ester compound containing at least two rings bonded by a group containing an unsaturated group, Patent Literature 12 describes a method for promoting flame retardancy using a fluorine-containing dicyanate ester compound, and Patent Literature 13 describes a method for promoting flame retardancy using a phenol novolac-based cyanate ester compound.

However, in these methods, a cured product of a single practical cyanate ester compound having all performance of dielectric characteristics, flame retardancy, and heat resistance, at high levels is not obtained.

On the other hand, it is known that a cured product of a cyanate ester compound having an aralkyl structure has low dielectric characteristics, high flame retardancy, and high heat resistance (see Patent Literature 14).

CITATION LIST

Patent Literature

Patent Literature 1: Japanese Patent Publication No. H4-24370
Patent Literature 2: Japanese Patent Laid-Open No. H2-286723
Patent Literature 3: Japanese Patent Laid-Open No. H7-207022
Patent Literature 4: Japanese Patent Laid-Open No. H6-122763
Patent Literature 5: Japanese Patent Laid-Open No. 2000-95938
Patent Literature 6: Japanese Patent Laid-Open No. 2003-128928
Patent Literature 7: Japanese Patent Laid-Open No. 2003-128753
Patent Literature 8: Japanese Patent Laid-Open No. 2003-128784
Patent Literature 9: Japanese Patent Laid-Open No. H6-228308
Patent Literature 10: Japanese Patent Laid-Open No. H6-49238
Patent Literature 11: National Publication of International Patent Application No. 2002-531989
Patent Literature 12: Japanese Patent Laid-Open No. S63-250359
Patent Literature 13: Japanese Patent Laid-Open No. 2002-206048
Patent Literature 14: Japanese Patent Laid-Open No. 2005-264154

SUMMARY OF INVENTION

Technical Problem

However, the cyanate ester compound having an aralkyl structure described in the above Patent Literature 14 does not dissolve readily in a solvent, and the viscosity of the solid is high, and the handling is difficult. Generally, when a laminate for printed wiring board applications and the like is formed using a cyanate ester compound, the step of making a prepreg by first dissolving the cyanate ester compound in a solvent, such as methyl ethyl ketone, to prepare a varnish, then impregnating a glass cloth with the varnish, and drying it is adopted. Therefore, the solvent solubility, viscosity, and stability of the cyanate ester compound are also important factors.

It is an object of the present invention to provide a novel cyanate ester compound that can realize a cured product having a low dielectric constant and dielectric loss tangent, and excellent flame retardancy and heat resistance, and moreover has relatively low viscosity, excellent solvent solubility, and also excellent handling properties, and a practical method for producing the same.

It is another object of the present invention to provide a curable resin composition, a prepreg, a laminate, a sealing material, a fiber-reinforced composite material, an adhesive, and the like comprising such a novel cyanate ester compound. It is a further object of the present invention to provide a cured product having a low dielectric constant and dielectric loss tangent, excellent flame retardancy and heat resistance, and also excellent handling properties.

Solution to Problem

The present inventors have studied diligently over and over in order to achieve the above objects, and, as a result, found that a cyanate obtained by cyanation of a phenol-modified xylene formaldehyde resin has relatively low viscosity, excellent solvent solubility, and excellent handling properties, and a curable resin composition using this cyanate ester compound can unexpectedly realize a cured product having a low dielectric constant and dielectric loss tangent, and excellent flame retardancy and heat resistance, and the like, leading to completion of the present invention.

Specifically, the present invention provides the following <1> to <16>.

<1> A cyanate ester compound obtained by cyanation of a phenol-modified xylene formaldehyde resin.

<2> The cyanate ester compound according to the above <1>, having a structure represented by the following general formula (I):

[Formula 1]

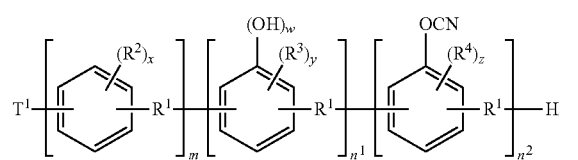

(I)

wherein $R^1$ each independently represents a methylene group, a methyleneoxy group, a methyleneoxymethylene group, or an oxymethylene group, $R^2$ to $R^4$ each independently represent a hydrogen atom, an alkyl group having 1 to 3 carbon atoms (preferably a methyl group), a hydroxyl group, or a hydroxymethylene group, $T^1$ represents a hydrogen atom, a hydroxyl group, or a hydroxymethylene group, x each independently represents an integer of 0 to 4 (preferably an integer of 0 to 2), y and z each independently represent an integer of 0 to 3 (preferably an integer of 0 to 2), w represents an integer of 0 or 1, m represents an integer of 0 or more, and $n^1$ and $n^2$ each independently represent an integer of 1 or more.

<3> The cyanate ester compound according to the above <1> or <2>, wherein the phenol-modified xylene formaldehyde resin is obtained by modifying a xylene formaldehyde resin using a phenol represented by the following general formula (1):

[Formula 2]

(1)

wherein Ar represents an aromatic ring, R represents all hydrogen atoms or monovalent substituents on the aromatic ring, the monovalent substituent is an alkyl group or an aryl group, and a plurality of Rs present on the aromatic ring may be the same or different provided that at least one of Rs is a hydrogen atom.

<4> The cyanate ester compound according to the above <3>, wherein the phenol represented by the general formula (1) is phenol and/or 2,6-xylenol.

<5> The cyanate ester compound according to any one of the above <1> to <4>, having a weight average molecular weight Mw of 250 to 10,000.

<6> A cyanate ester compound having a structure represented by the following general formula (I):

[Formula 3]

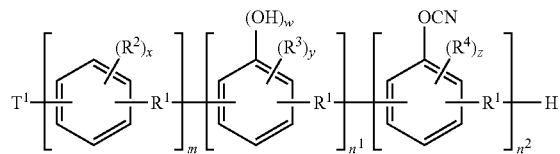

(I)

wherein $R^1$ each independently represents a methylene group, a methyleneoxy group, a methyleneoxymethylene group, or an oxymethylene group, $R^2$ to $R^4$ each independently represent a hydrogen atom, an alkyl group having 1 to 3 carbon atoms (preferably a methyl group), a hydroxyl group, or a hydroxymethylene group, $T^1$ represents a hydrogen atom, a hydroxyl group, or a hydroxymethylene group, x each independently represents an integer of 0 to 4 (preferably an integer of 0 to 2), y and z each independently represent an integer of 0 to 3 (preferably an integer of 0 to 2), w represents an integer of 0 or 1, m represents an integer of 0 or more, and $n^1$ and $n^2$ each independently represent an integer of 1 or more.

<7> The cyanate ester compound according to the above <6>, having a weight average molecular weight Mw of 250 to 10,000.

<8> A method for producing the cyanate ester compound according to any one of the above <1> to <5>, comprising steps of:

phenol-modifying a xylene formaldehyde resin; and
cyanating a phenolic hydroxyl group of an obtained phenol-modified xylene formaldehyde resin.

<9> A curable resin composition comprising the cyanate ester compound according to any one of the above <1> to <7>.

<10> The curable resin composition according to the above <9>, further comprising at least one or more selected from the group consisting of a cyanate ester compound other than the cyanate ester compound according to any one of the above <1> to <7>, an epoxy resin, an oxetane resin, and a compound having a polymerizable unsaturated group.

<11> A cured product obtained by curing the curable resin composition according to the above <9> or <10>.

<12> A prepreg obtained by impregnating or coating a fiber substrate with the curable resin composition according to the above <9> or <10>, and drying the curable resin composition.

<13> A laminate obtained by laminating metal foil on the prepreg according to the above <12>, and hot-pressing the metal foil and the prepreg.

<14> A sealing material comprising the curable resin composition according to the above <9> or <10>.

<15> A fiber-reinforced composite material comprising the curable resin composition according to the above <9> or <10>.

<16> An adhesive comprising the curable resin composition according to the above <9> or <10>.

Advantageous Effects of Invention

The present invention can realize a novel cyanate ester compound having relatively low viscosity, excellent solvent solubility, and excellent handling properties. In addition, use of this cyanate ester compound can realize a curable resin composition, a cured product, and the like having excellent flame retardancy, a low dielectric constant, a low dielectric loss tangent, a high glass transition temperature of more than 200° C., and also excellent handling properties.

DESCRIPTION OF EMBODIMENTS

Embodiments of the present invention will be described below. The following embodiments are illustrations for explaining the present invention, and the present invention is not limited only to the embodiments.

A cyanate ester compound in this embodiment is obtained, for example, by cyanation of a phenol-modified xylene formaldehyde resin, though the method for producing the cyanate ester compound is not particularly limited. By cyanation of a phenol-modified xylene formaldehyde resin in this manner, a cyanate ester compound that has excellent flame retardancy and high curability, and provides a cured product having high glass transition temperature is obtained.

The phenol-modified xylene formaldehyde resin that is a raw material of the cyanate ester compound in this embodiment is obtained by phenol-modifying a xylene formaldehyde resin. Here, the xylene formaldehyde resin is an aromatic hydrocarbon formaldehyde resin obtained by reacting (meta)xylene with formaldehyde under an acidic catalyst. In addition, phenol-modified means those modified using a phenol (a compound having a phenolic hydroxyl group) herein.

Phenol modification of the xylene formaldehyde resin can be performed according to a method known in the industry, and the method is not particularly limited. For example, a phenol-modified xylene formaldehyde resin can be obtained by reacting a xylene formaldehyde resin with a phenol in the presence of an acidic catalyst. As the acidic catalyst, for example, an inorganic acid, such as sulfuric acid, hydrochloric acid, or phosphoric acid, an organic acid, such as oxalic acid, malonic acid, succinic acid, adipic acid, sebacic acid, citric acid, fumaric acid, maleic acid, formic acid, para-toluenesulfonic acid, methanesulfonic acid, trifluoroacetic acid, dichloroacetic acid, trichloroacetic acid, trifluoromethanesulfonic acid, benzenesulfonic acid, naphthalenesulfonic acid, or naphthalenedisulfonic acid, a Lewis acid, such as zinc chloride, aluminum chloride, iron chloride, or boron trifluoride, or an solid acid, such as silicotungstic acid, phosphotungstic acid, silicomolybdic acid, or phosphomolybdic acid, can be preferably used. In addition, the reaction temperature is generally preferably 50° C. to 200° C. After completion of the reaction, the target material can be recovered by performing neutralization of the acidic catalyst, dilution with an organic solvent, such as methyl ethyl ketone or meta-xylene, water washing, extraction, distillation, distilling off of the unreacted phenol, and the like according to an ordinary method.

The phenol used for the above phenol modification is not particularly limited as long as it is a compound having a phenolic hydroxyl group (generally a compound in which a hydroxyl group is bonded to an aromatic ring, such as a benzene ring). For example, a phenol represented by the following general formula (1) is preferably used.

[Formula 4]

(1)

wherein Ar represents an aromatic ring, R represents all hydrogen atoms or monovalent substituents on the aromatic ring, the monovalent substituent is an alkyl group or an aryl group, and a plurality of Rs present on the aromatic ring may be the same or different provided that at least one of Rs is a hydrogen atom.

In the above general formula (1), examples of the aromatic ring include, but are not particularly limited to, a benzene ring, a naphthalene ring, and an anthracene ring. In addition, examples of the alkyl group of R include, but are not particularly limited to, linear or branched alkyl groups having 1 to 8 carbon atoms, more preferably linear or branched alkyl groups having 1 to 4 carbon atoms, for example, a methyl group, an ethyl group, a propyl group, an isopropyl group, a butyl group, a sec-butyl group, and a tert-butyl group. Further, examples of the aryl group of R include, but are not particularly limited to, a phenyl group, a p-tolyl group, a naphthyl group, and an anthryl group. Among these, for the phenol represented by the following general formula (1), those in which Ar is a benzene ring, and R is zero to three alkyl groups, and those in which Ar is a benzene ring, and R is zero to two aryl groups are preferred.

Specific examples of the phenol represented by the above general formula (1) include phenol, 2,6-xylenol, naphthol, and biphenol. Among these, phenol and 2,6-xylenol are preferred in terms of handling.

The main product of the phenol-modified xylene formaldehyde resin obtained after the reaction is one in which the aromatic rings (for example, benzene rings) of the xylene and the phenol are bonded to each other via a methylene group that is formed from the formaldehyde during the reaction. The phenol-modified xylene formaldehyde resin obtained after the reaction is obtained as a mixture of many compounds because the positions where the formaldehyde is bonded to the aromatic rings of the xylene and the phenol, the position where the phenol is bonded, the degree of polymerization, and the like are not the same.

For example, a phenol-modified xylene formaldehyde resin obtained by refluxing a water solvent for 7 hours with xylene, an aqueous formalin solution, 2,6-xylenol, and concentrated sulfuric acid in a nitrogen gas flow, and then neutralizing the acid followed by extraction with an organic solvent is a mixture containing compounds represented by the following formulas (2) to (5) as a typical composition.

[Formula 5]

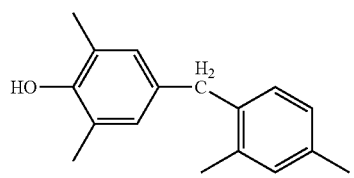

(2)

[Formula 6]

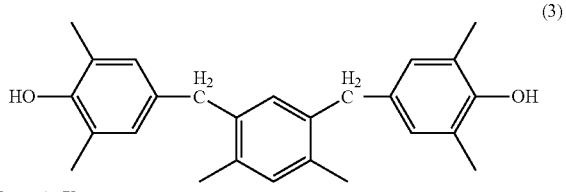

(3)

[Formula 7]

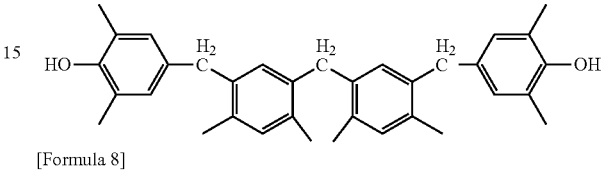

(4)

[Formula 8]

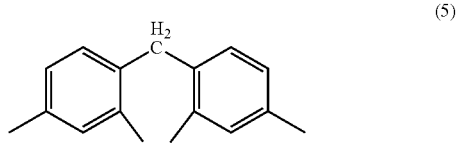

(5)

Among these, the aromatic hydrocarbon compound having no hydroxyl group in the structure like the above formula (5) is preferably previously removed by distillation separation or the like because it cannot be cyanated.

In terms of further enhancing handling properties and further enhancing the properties, such as dielectric constant, dielectric loss tangent, flame retardancy, and heat resistance, of the obtained curable resin composition and cured product, the phenol-modified xylene formaldehyde resin preferably has an OH value of 150 to 400 mg KOH/g, more preferably 200 to 350 mg KOH/g, as obtained based on JISK1557-1.

For the phenol-modified xylene formaldehyde resin, commercial products can also be used. As the commercial products, for example, NIKANOL GL16 and NIKANOL G manufactured by Fudow Company Limited are preferably used.

The cyanate ester compound in this embodiment can be obtained by cyanation of the hydroxyl groups of the above phenol-modified xylene formaldehyde resin. The synthesis method is not particularly limited, and known methods can be applied.

For example, the cyanate ester compound can be obtained by cyanation of phenol by a method described in IAN HAMERTON, "Chemistry and Technology of Cyanate Ester Resins," BLACKIE ACADEMIC & PROFESSIONAL. In addition, a method of reacting in a solvent in the presence of a base such that a cyanogen halide is always present in excess of the base (U.S. Pat. No. 3,553,244), a method of synthesizing using a tertiary amine as a base in excess of a cyanogen halide (Japanese Patent Laid-Open No. 7-53497), a method of reacting a trialkylamine with a cyanogen halide in a continuous plug flow mode (National Publication of International Patent Application No. 2000-501138), a method of treating, with a cation and anion exchange pair, a tert-ammonium halide produced as a by-product in reacting phenol with a cyanogen halide in a nonaqueous solution in the presence of a tert-amine (National Publication of International Patent Application No. 2001-504835), a method of reacting a phenol compound in the presence of a solvent separable from water by simultaneously adding a tertiary amine and a cyanogen halide, followed by water washing and separation, and precipitation and purification from the obtained solution using a poor solvent of a secondary or tertiary alcohol or a hydrocarbon (Japanese Patent No. 2991054), and further, a method of reacting a naphthol, a cyanogen halide, and a tertiary amine in a two-phase solvent of water and an organic solvent under acidic conditions (Japanese Patent Laid-Open No. 2007-277102), and the like are known. The cyanate ester compound in this embodiment can be obtained preferably using these known methods. The obtained cyanate ester compound can be identified by a known method, such as NMR.

As a specific illustration, by reacting a 2,6-xylenol-modified xylene formaldehyde resin represented by general formulas (2) to (4) with cyanogen chloride in a solvent in the presence of a basic compound, a cyanate (mixture) containing compounds represented by general formulas (6) to (8) as a typical composition can be obtained.

[Formula 9]

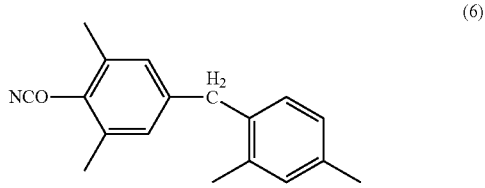

(6)

[Formula 10]

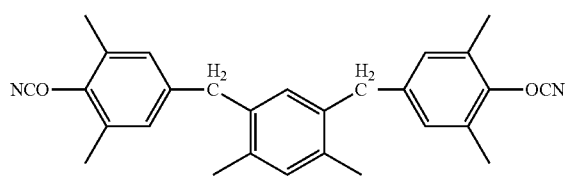

(7)

[Formula 11]

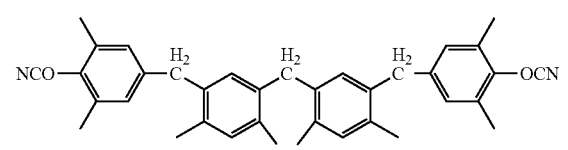

(8)

Among the above-described cyanate ester compounds, one represented by the following formula (I) is preferred in terms of curability and flame resistance.

[Formula 12]

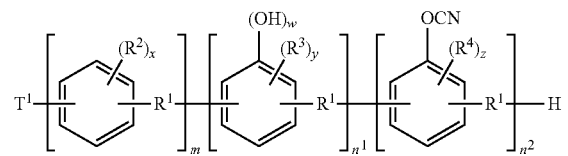

(I)

wherein $R^1$ each independently represents a methylene group, a methyleneoxy group, a methyleneoxymethylene group, or an oxymethylene group, $R^2$ to $R^4$ each independently represent a hydrogen atom, an alkyl group having 1 to 3 carbon atoms (preferably a methyl group), a hydroxyl group, or a hydroxymethylene group, $T^1$ represents a hydrogen atom, a hydroxyl group, or a hydroxymethylene group, x each independently represents an integer of 0 to 4 (preferably an integer of 0 to 2), y and z each independently represent an integer of 0 to 3 (preferably an integer of 0 to 2), w represents an integer of 0 or 1, m represents an integer of 0 or more, and $n^1$ and $n^2$ each independently represent an integer of 1 or more.

In the above formula (I), m, $n^1$, and $n^2$ represent the ratio of constituent units, and the arrangement of repeating units is arbitrary. In other words, the compound of formula (I) may be a random copolymer or a block copolymer (the same applies to all the ratios of constituent units herein). In addition, the compound of formula (I) may be crosslinked and linked by two or more of $R^1$. The upper limit value of m is usually 50 or less, preferably 20 or less, and the upper limit values of $n^1$ and $n^2$ are each usually 20 or less.

The weight average molecular weight Mw of the cyanate ester compound in this embodiment is not particularly limited, and is preferably 250 to 10,000, more preferably 300 to 5,000.

Next, a curable resin composition in this embodiment will be described.

The curable resin composition in this embodiment comprises the above-described cyanate ester compound. This curable resin composition may contain a cyanate ester compound other than the above-described cyanate ester compound (hereinafter referred to as "another cyanate ester compound"), an epoxy resin, an oxetane resin, and/or a compound having a polymerizable unsaturated group, and the like in a range in which the expected characteristics are not impaired.

As the another cyanate ester compound, those generally known can be used, and the another cyanate ester compound is not particularly limited. Examples thereof include bisphenol A dicyanate, bisphenol F dicyanate, bisphenol M dicyanate, bisphenol P dicyanate, bisphenol E dicyanate, phenol novolac-based cyanate, cresol novolac-based cyanate, dicyclopentadiene novolac-based cyanate, tetramethyl bisphenol F dicyanate, and biphenol dicyanate. One of these cyanate ester compounds can be used alone, or two or more of these cyanate ester compounds can be mixed and used.

As the epoxy resin, those generally known can be used, and the epoxy resin is not particularly limited. Examples thereof include bisphenol A-based epoxy resins, bisphenol E-based epoxy resins, bisphenol F-based epoxy resins, bisphenol S-based epoxy resins, bisphenol A novolac-based epoxy resins, biphenyl-based epoxy resins, phenol novolac-based epoxy resins, cresol novolac-based epoxy resins, xylene novolac-based epoxy resins, naphthalene-based epoxy resins, anthracene-based epoxy resins, trifunctional phenol-based epoxy resins, tetrafunctional phenol-based epoxy resins, triglycidyl isocyanurate, glycidyl ester-based epoxy resins, alicyclic epoxy resins, dicyclopentadiene novolac-based epoxy resins, biphenyl novolac-based epoxy resins, phenol aralkyl novolac-based epoxy resins, naphthol aralkyl novolac-based epoxy resins, aralkyl novolac-based epoxy resins, biphenyl aralkyl-based epoxy resins, naphthol aralkyl-based epoxy resins, dicyclopentadiene-based epoxy resins, polyol-based epoxy resins, alicyclic epoxy resins, or halides thereof. One of these epoxy resins can be used alone, or two or more of these epoxy resins can be mixed and used.

As the oxetane resin, those generally known can be used, and the oxetane resin is not particularly limited. Examples thereof include alkyloxetanes, such as oxetane, 2-methyloxetane, 2,2-dimethyloxetane, 3-methyloxetane, and 3,3- dimethyloxetane, 3-methyl-3-methoxymethyloxetane, 3,3'-di(trifluoromethyl)perfluorooxetane, 2-chloromethyloxetane, 3,3-bis(chloromethyl)oxetane, OXT-101 (trade name manufactured by Toagosei Co., Ltd.), and OXT-121 (trade name manufactured by Toagosei Co., Ltd.). One of these oxetane resins can be used alone, or two or more of these oxetane resins can be mixed and used.

When the epoxy resin and/or the oxetane resin is used in the curable resin composition, an epoxy resin curing agent and/or an oxetane resin curing agent can also be used as required. As the epoxy resin curing agent, those generally known can be used, and the epoxy resin curing agent is not particularly limited. Examples thereof can include imidazole derivatives, such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole, dicyandiamide, amine compounds, such as benzyldimethylamine and 4-methyl-N,N-dimethylbenzylamine, and phosphine-based or phosphonium-based phosphorus compounds. In addition, as the oxetane resin curing agent, those generally known can be used, and the oxetane resin curing agent is not particularly limited. Examples thereof include cationic polymerization initiators. Examples of commercial cationic polymerization initiators include San-Aid SI60L, San-Aid SI-80L, and San-Aid SI100L (manufactured by SANSHIN CHEMICAL INDUSTRY CO., LTD.), CI-2064 (manufactured by Nippon Soda Co., Ltd.), IRGACURE 261 (manufactured by Ciba Specialty Chemicals), ADEKA OPTOMER SP-170 and ADEKA OPTOMER SP-150 (manufactured by ADEKA CORPORATION), and Cyracure UVI-6990 (manufactured by UCC). In addition, the cationic polymerization initiator can also be used as an epoxy resin curing agent. One of these curing agents can be used alone, or two or more of these curing agents can be used in combination.

As the compound having a polymerizable unsaturated group, those generally known can be used, and the compound having a polymerizable unsaturated group is not particularly limited. Examples thereof include vinyl compounds, such as ethylene, propylene, styrene, divinylbenzene, and divinylbiphenyl, (meth)acrylates of monohydric or polyhydric alcohols, such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate, epoxy (meth)acrylates, such as bisphenol A-based epoxy (meth)acrylate and bisphenol F-based epoxy (meth)acrylate, benzocyclobutene resins, and (bis)maleimide resins. One of these compounds having an unsaturated group can be used alone, or two or more of these compounds can be mixed and used.

When the compound having a polymerizable unsaturated group is used, a known polymerization initiator can also be used as required. As the polymerization initiator, those generally known can be used, and the polymerization initiator is not particularly limited. Examples thereof include peroxides, such as benzoyl peroxide, p-chlorobenzoyl peroxide, di-t-butyl peroxide, diisopropyl peroxycarbonate, and di-2-ethylhexyl peroxycarbonate, and azo compounds, such as azobisisobutyronitrile. One of these polymerization initiators can be used alone, or two or more of these polymerization initiators can be used in combination.

Further, the curable resin composition in this embodiment may contain known additives, such as a thermoplastic resin, an inorganic filler, a curing catalyst, a curing accelerator, a coloring pigment, a defoaming agent, a surface adjusting agent, a flame retardant, an ultraviolet absorbing agent, an antioxidant, a photopolymerization initiator, a fluorescent brightening agent, a photosensitizer, a dye, a pigment, a thickening agent, a lubricant, a flow adjusting agent, a dispersing agent, a leveling agent, a brightening agent, a polymerization inhibitor, and a silane coupling agent, as required. In addition, the curable resin composition may contain a solvent as required. One of these optional additives can be used alone, or two or more of these optional additives can be used in combination.

As the inorganic filler, those generally known can be used, and the inorganic filler is not particularly limited. Examples thereof include silicas, such as natural silica, synthetic silica, fused silica, amorphous silica, and hollow silica, boehmite, molybdenum compounds, such as molybdenum oxide and zinc molybdate, white carbon, titanium white, AEROSIL, silicone composite powders, silicone resin powders, zinc borate, zinc stannate, alumina, talc, natural mica, synthetic mica, kaolin, clay, calcined clay, calcined kaolin, calcined talc, zinc oxide, magnesium oxide, zirconium oxide, aluminum hydroxide, boron nitride, barium sulfate, E-glass, A-glass, NE-glass, C-glass, L-glass, D-glass, S-glass, M-glass G20, glass short fibers (including glass fine powders of E-glass, T-glass, D-glass, S-glass, Q-glass, and the like), hollow glass, and spherical glass. One of these inorganic fillers can be used alone, or two or more of these inorganic fillers can be used in combination.

In addition, as the curing catalyst, those generally known can be used, and the curing catalyst is not particularly limited. Examples thereof include metal salts, such as zinc octylate, zinc naphthenate, cobalt naphthenate, copper naphthenate, and acetylacetone iron, and compounds having an active hydroxyl group, such as phenols, alcohols, and amines. One of these curing catalysts can be used alone, or two or more of these curing catalysts can be used in combination.

As the solvent, those generally known can be used, and the solvent is not particularly limited. Examples thereof include, but are not particularly limited to, ketone-based solvents, such as acetone, methyl ethyl ketone, methyl isobutyl ketone, and cyclohexanone, cellosolve-based solvents, such as propylene glycol monomethyl ether and propylene glycol monomethyl ether acetate, ester-based solvents, such as ethyl lactate, methyl acetate, ethyl acetate, butyl acetate, isoamyl acetate, ethyl lactate, methyl methoxypropionate, and methyl hydroxyisobutyrate, alcohol-based solvents, such as methanol, ethanol, isopropanol, and 1-ethoxy-2-propanol, and aromatic hydrocarbons, such as toluene, xylene, and anisole. One of these solvents can be used alone, or two or more of these solvents can be used in combination.

By curing the above curable resin composition, a cured product in this embodiment can be obtained. The curing method is not particularly limited. For example, the above-described curable resin composition can be cured by heat, light, or the like. In addition, for example, by melting the above-described curable resin composition or dissolving it in a solvent, then pouring the melt or the solution into a mold, and curing it under usual conditions, a cured product having the desired shape can be obtained. The treatment temperature in the case of thermal curing is not particularly limited, and is preferably in the range of 120 to 300° C. in terms of promoting the curing reaction and suppressing deterioration in the performance of the obtained cured product.

<Applications of Curable Resin Composition>

By impregnating or coating a substrate with the above curable resin composition, and drying it, a prepreg can be produced. As the substrate used here, those generally known can be used, for example, inorganic fiber substrates and organic fiber substrates, and the substrate is not particularly limited.

The above substrate is not particularly limited. Examples thereof include glass fiber substrates, such as glass woven cloths and glass nonwoven cloths, inorganic fiber substrates of materials other than glass, such as quartz, and organic fiber substrates, such as synthetic fiber substrates composed of woven cloths or nonwoven cloths comprising, as main components, polyamide-based resin fibers, such as polyimide resin fibers, polyamide resin fibers, aromatic polyamide resin fibers, and wholly aromatic polyamide resin fibers, polyester-based resin fibers, such as polyester resin fibers, aromatic polyester resin fibers, and wholly aromatic polyester resin fibers, polyimide resin fibers, fluororesin fibers, and the like, and paper substrates, comprising, as main components, kraft paper, cotton linter paper, mixed paper of linters and kraft pulp, and the like. These known ones can be appropriately selected and used according to performance required of the prepreg, for example, strength, a water absorption rate, and a thermal expansion coefficient.

The glass constituting the above glass fiber substrates is not particularly limited. Examples thereof include E-glass, D-glass, C-glass, A-glass, S-glass, D-glass, Q-glass, NE-glass, T-glass, and H-glass.

For the method for producing the above prepreg, those generally known can be appropriately applied, and the method is not particularly limited. The prepreg can be produced by applying, for example, a method of preparing a resin varnish using the above-described curable resin composition, and immersing a substrate in the resin varnish, a method of coating by various coaters, or a method of spraying by a spray. Among these, the method of immersing a substrate in a resin varnish is preferred. By this, the impregnation properties of the resin composition into a substrate can be improved. When a substrate is immersed in a resin varnish, usual impregnation and coating equipment can be used. For example, a method for producing a prepreg by impregnating an inorganic and/or organic fiber substrate with a resin composition varnish, drying it, and B-staging it, and the like can be applied.

In addition, the curable resin composition in this embodiment can also be used in metal-clad laminate and multilayer plate applications. For the methods for producing these laminates and the like, those generally known can be appropriately applied, and the methods are not particularly limited. For example, by laminating the above prepreg and metal foil, and hot-pressing them, a laminate can be obtained. At this time, the heating temperature is not particularly limited, and is usually preferably 65 to 300° C., more preferably 120 to 270° C. In addition, the applied pressure is not particularly limited, and is usually preferably 2 to 5 MPa, more preferably 2.5 to 4 MPa.

Further, a sealing material can be produced using the above curable resin composition. For the method for producing a sealing material, those generally known can be appropriately applied, and the method is not particularly limited. For example, by mixing the above-described curable resin composition, and various additives known in sealing material applications, a solvent, or the like, using a known mixer, a sealing material can be produced. For the method for adding a cyanate ester compound, various additives, and a solvent in mixing, those generally known can be appropriately applied, and the method is not particularly limited.

Further, a fiber-reinforced composite material can be produced using the above curable resin composition. For the method for producing a fiber-reinforced composite material, those generally known can be appropriately applied, and the method is not particularly limited. For example, a fiber-reinforced composite material can be produced by combining (integrating) the above-described curable resin composition with reinforcing fibers.

The reinforcing fibers are not particularly limited, and, for example, fibers such as carbon fibers, glass fibers, aramid fibers, boron fibers, PBO fibers, high strength polyethylene fibers, alumina fibers, and silicon carbide fibers can be used. The form and arrangement of the reinforcing fibers are not particularly limited, and can be appropriately selected from woven fabrics, nonwoven cloths, mats, knits, braids, unidirectional strands, rovings, chopped, and the like. In addition, as the form of the reinforcing fibers, for example, a preform (a laminate of woven ground cloths comprising reinforcing fibers, or the laminate sewn and integrated by a stitching thread, or a fiber structure, such as a three-dimensional woven fabric or braided fabric) can also be applied. Examples of a more specific method for producing a fiber-reinforced composite material include liquid composite molding methods, resin film infusion methods, filament winding methods, hand lay-up methods, and pultrusion methods. Among these, a resin transfer molding method, one of liquid composite molding methods, is preferably used when a composite material having a relatively complicated shape is mass-produced in a short time because in the resin transfer molding method, a material other than a preform, such as a metal plate, a foam core, or a honeycomb core, can be previously set in a mold, and various applications can be addressed.

In addition, an adhesive can be produced using the above curable resin composition. For the method for producing an adhesive, those generally known can be appropriately applied, and the method is not particularly limited. For example, by mixing the above-described curable resin composition, and various additives known in adhesive applications, a solvent, or the like, using a known mixer, an adhesive can be produced. For the method for adding a cyanate ester compound, various additives, and a solvent in mixing, those generally known can be appropriately applied, and the method is not particularly limited.

The curable resin composition in this embodiment can realize a cured product having excellent handling properties, and further a low dielectric constant and dielectric loss tangent, and excellent flame retardancy and heat resistance, and therefore can be used in wide applications where this performance is required, and its applications are not limited to those described above. In other words, the curable resin composition in this embodiment can realize a cured product having, in addition to the above properties, for example, excellent low thermal expansion properties and low water absorbency, and therefore is extremely useful as a highly functional polymer material, and can be used in wide applications as a material having excellent thermal, electrical, and mechanical properties.

EXAMPLES

The present invention will be described in more detail below by giving synthesis examples, Examples, and Comparative Examples, but the present invention is not limited in any way by these examples. "Parts" indicates "parts by mass" unless otherwise specified below.

Example 1

Synthesis of Cyanate of 2,6-Xylenol-modified Xylene Formaldehyde Resin (Cyanate of Following Formula (Ia) (Having Following Formula (9) as Typical Composition): Abbreviated as NXDC)

[Formula 13]

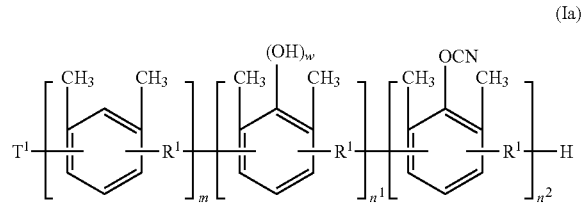

(Ia)

wherein $R^1$, $T^1$, w, m, $n^1$, and $n^2$ have the same meanings as those described in the above-described formula (I).

[Formula 14]

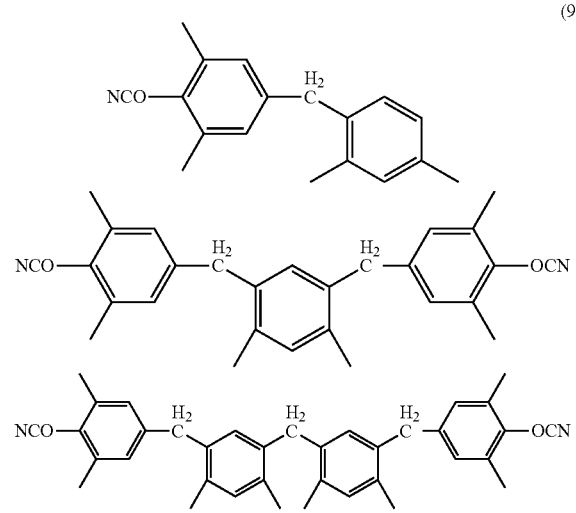

(9)

<Synthesis of 2,6-Xylenol-modified Xylene Formaldehyde Resin>

486.8 g (3.99 mol) of 2,6-xylenol and 6.3 g of PTSA (para-toluenesulfonic acid), a catalyst, were charged, and stirred and heated, and at a point when a liquid temperature of 125° C. was reached, 144 g of a xylene formaldehyde resin (NIKANOL GL16, manufactured by Fudow Company Limited) was dropped over 1 hour. During the dropping, the heating was continued, and the reaction was completed in 3 hours at 150° C. After the reaction, the reaction liquid was cooled to 120° C. or less. 160 g of meta-xylene was added to the reaction liquid, and then, 240 g of methyl isobutyl ketone was added to dilute the reaction liquid. Then, the diluted reaction liquid was repeatedly washed with 400 g of hot water at 70 to 80° C. 3 times.

Next, solvent removal and distilling off of unreacted 2,6-xylenol were performed by a distillation operation to obtain 362 g of a crude product of a 2,6-xylenol-modified xylene formaldehyde resin represented by the following formula (Ia').

[Formula 15]

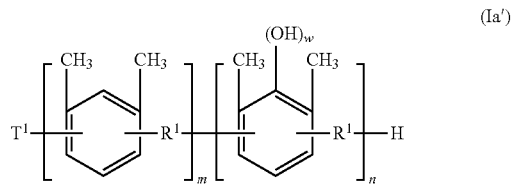

(Ia')

wherein $R^1$, $T^1$, and w have the same meanings as those described in the above-described formula (I), and n has the same meaning as $n^2$ described in the above-described formula (I).

A mixture obtained by adding 300 g of meta-xylene to 292 g of the obtained crude product was stirred and dissolved on a hot water bath (some crystals remained), and cooled with ice water with continuous stirring to precipitate crystals. Then, a filtration operation was performed by a G-3 filter to remove the crystals. Further, the solvent was distilled off from the filtrate by a distillation operation to obtain 175 g of a purified product of the 2,6-xylenol-modified xylene formaldehyde resin.

The OH value of the obtained 2,6-xylenol-modified xylene formaldehyde resin was obtained based on JISK1557-1, and was 318 mg KOH/g.

<Synthesis of Cyanated Product of 2,6-Xylenol-modified Xylene Formaldehyde Resin (NXDC)>

256 g of the purified product of the 2,6-xylenol-modified xylene formaldehyde resin represented by formula (Ia') (1.45 mol of OH groups) obtained by the above method and 1.6 mol of triethylamine were dissolved in 600 mL of 3-methyltetrahydrofuran (a solution 1). Then, the solution 1 was dropped into 500 g of a methylene chloride solution of 2.8 mol of cyanogen chloride at −10° C. over 1.5 hours. The mixture was stirred for 30 minutes. Then, a mixed solution of 0.8 mol of triethylamine and 115 g of methylene chloride was dropped, and further, the mixture was stirred for 30 minutes to complete the reaction. Then, the hydrochloride of triethylamine was filtered off from the reaction liquid, and the obtained filtrate was washed with 1,000 mL of 0.1 N hydrochloric acid, then further washed with 1,000 mL of an aqueous NaCl solution 3 times, and finally washed with 1,000 mL of water. The methylene chloride solution was dried with sodium sulfate, and the solvent was distilled off by a distillation operation to obtain 240 g of the target cyanate of a 2,6-xylenol-modified xylene formaldehyde resin (NXDC) represented by the above formula (Ia) as a yellow-red viscous material.

It was possible to dissolve 30% by mass or more of the compound in methyl ethyl ketone at 25° C. In addition, the viscosity was measured using a rheometer AR2000EX manufactured by TA Instruments, and the viscosity of the compound was 0.3 Pa·s at 100° C. Measurement was performed by GPC, and the weight average molecular weight (Mw) of the compound was 650.

Example 2

Preparation of Curable Resin Composition and Making of Cured Product

100 Parts by mass of the cyanate NXDC obtained in Example 1 was placed in an eggplant-shaped flask, heated and melted at 150° C., and degassed by a vacuum pump. Then, 0.05 parts by mass of zinc octylate was added, and the mixture was shaken and mixed for 1 minute to prepare a curable resin composition.

The obtained curable resin composition was poured into a mold made using a glass plate (120 mm×120 mm×5 mmt), a polyimide film (Kapton 200H: DU PONT-TORAY CO., LTD.), and an O ring made of fluororubber (S-100: Morisei), and heated and cured at 170° C. for 1 hour, and then further at 230° C. for 9 hours, using an oven, to cast-mold a cured product. After cooling, the polyimide film was removed by polishing, to take out the cured product.

The characteristics of the obtained cured product were evaluated by the following methods.

Glass transition temperature (Tg): The Glass transition temperature (Tg) was obtained by dynamic viscoelasticity measurement (DMA). The measurement was performed at a vibration frequency of 10 GHz.

Dielectric constant and dielectric loss tangent: The dielectric constant and dielectric loss tangent were obtained by a cavity resonance perturbation method using HP8722ES manufactured by Agilent.

Flame retardancy: A flame resistance test was carried out based on UL94. The sample size was 10 mm×70 mm×1.5 mm.

The evaluation results are shown in Table 1.

Example 3

Synthesis of Cyanate of Phenol-modified Xylene Formaldehyde Resin (Cyanate of Following Formula (Ib) (Having Following Formula (10) as Typical Composition): Abbreviated as GLPC)

[Formula 16]

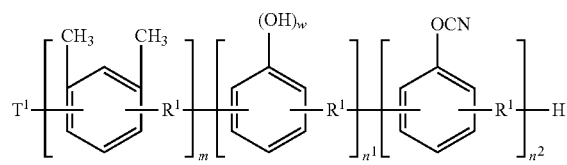
(Ib)

wherein $R^1$, $T^1$, w, m, $n^1$, and $n^2$ have the same meanings as those described in the above-described formula (I).

[Formula 17]

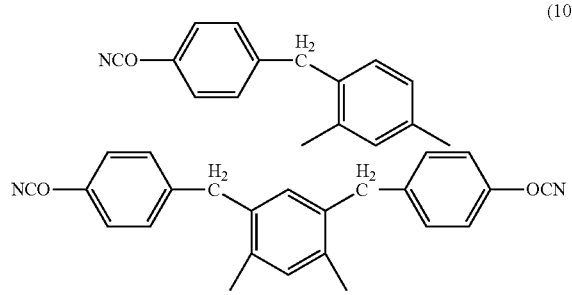
(10)

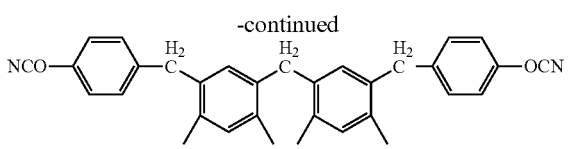

<Synthesis of Phenol-modified Xylene Formaldehyde Resin>

800 g (8.5 mol) of phenol and 0.43 g of PTSA (para-toluenesulfonic acid), a catalyst, were charged, and stirred and heated, and 670 g of a xylene formaldehyde resin (NIKANOL G, manufactured by Fudow Company Limited) was dropped at a liquid temperature of 130° C. over 1 hour. During the dropping, the reflux temperature decreased from 150° C. to 105° C. The reaction was completed in 1 hour after the dropping. After the reaction, steam distillation was carried out at 170° C. for 2.5 hours for phenol removal. Then, 1700 g of methyl isobutyl ketone was gradually added with cooling, to dilute the reaction liquid. Then, the diluted reaction liquid was repeatedly washed with 850 g of hot water at 70 to 80° C. 3 times.

Next, solvent removal and distilling off of a slight amount of phenol were performed by a distillation operation to obtain 1130 g of a phenol-modified xylene formaldehyde resin represented by the following formula (Ib').

The OH value of the obtained phenol-modified xylene formaldehyde resin was obtained based on JISK1557-1, and was 314 mg KOH/g.

[Formula 18]

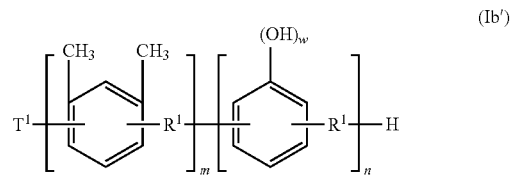
(Ib')

wherein $R^1$, $T^1$, and w have the same meanings as those described in the above-described formula (I), and n has the same meaning as $n^2$ described in the above-described formula (I).

<Synthesis of Cyanate of Phenol-modified Xylene Formaldehyde Resin (GLPC)>

20 g of the phenol-modified xylene formaldehyde resin represented by formula (Ib') (0.112 mol of OH groups) obtained by the above method and 17.13 g (0.168 mol) of triethylamine were dissolved in 120 g of methylene chloride (a solution 2). The solution 2 was dropped into a solution obtained by stirring and mixing 48.1 g of a methylene chloride solution of 0.249 mol of cyanogen chloride, 23.76 g (0.235 mol) of 36% hydrochloric acid, and 147.3 g of water at −5 to +5° C. over 10 minutes. The mixture was stirred for 30 minutes. Then, a mixed solution of 11.42 g (0.112 mol) of triethylamine and 11.4 g of methylene chloride was dropped, and further, the mixture was stirred for 30 minutes to complete the reaction. The reaction liquid was separated, and the organic phase was fractionated. The obtained organic phase was washed with 100 g of water 4 times, and then, the methylene chloride was distilled off by distillation to obtain 23.1 g of the target cyanate of a phenol-modified xylene formaldehyde resin (GLPC) represented by the above formula (Ib) as a yellow-red viscous material.

It was possible to dissolve 30% by mass or more of the compound in methyl ethyl ketone at 25° C. In addition, the viscosity was measured using a rheometer AR2000EX manufactured by TA Instruments, and the viscosity of the compound was 0.4 Pa·s at 100° C.

Measurement was performed by GPC, and the weight average molecular weight (Mw) of the compound was 1050.

Example 4

A curable resin composition was prepared and a cured product was made as in Example 2 except that instead of the NXDC, the GLPC obtained in Example 3 was used.

The evaluation results of the properties of the obtained cured product are shown in Table 1.

Comparative Example 1

A curable resin composition was prepared and a cured product was made as in Example 2 except that instead of the NXDC, bisphenol A dicyanate skylex (manufactured by MITSUBISHI GAS CHEMICAL COMPANY, INC.) was used alone.

It was possible to dissolve 30% by mass or more of the above bisphenol A dicyanate skylex in methyl ethyl ketone at 25° C. In addition, the viscosity was measured using a rheometer AR2000EX manufactured by TA Instruments, and the viscosity was 0.02 Pa·s at 100° C.

The evaluation results of the properties of the obtained cured product are shown in Table 1.

Comparative Example 2

A curable resin composition was prepared and a cured product was made as in Example 2 except that instead of the NXDC, phenol novolac cyanate PT30 (manufactured by Lonza) was used.

It was possible to dissolve 30% by mass or more of the above phenol novolac cyanate PT30 in methyl ethyl ketone at 25° C. In addition, the viscosity was measured using a rheometer AR2000EX manufactured by TA Instruments, and the viscosity was 0.5 Pa·s at 100° C.

The evaluation results of the properties of the obtained cured product are shown in Table 1.

As is also clear from Table 1, it was confirmed that the cured products of the curable resin compositions using the cyanated products of the phenol-modified xylene formaldehyde resins of the present invention had a lower dielectric constant and dielectric loss tangent and better flame retardancy than those using the cyanated products that were conventional products. Moreover, it was confirmed that both of these cured products had a high glass transition temperature of more than 200° C. and excellent heat resistance like the conventional products. In addition, it was confirmed that the cyanated products of the phenol-modified xylene formaldehyde resins of the present invention had low viscosity, excellent solvent solubility, and also excellent handling properties.

This application claims priority from Japanese Patent Application No. 2011-174070 filed with the Japan Patent Office on Aug. 9, 2011, the content of which is incorporated herein by reference.

INDUSTRIAL APPLICABILITY

As described above, the present invention can realize not only a cured product having excellent handling properties, a low dielectric constant and dielectric loss tangent, and excellent flame retardancy and heat resistance, but also a cured product having excellent low thermal expansion properties and low water absorbency, and therefore can be widely and effectively used in various applications where this performance is required. For example, the present invention can be effectively used in the fields of electrical insulating materials, sealing materials, adhesives, lamination materials, resists, and buildup laminate materials, as well as fixing materials, structural members, reinforcing agents, casting materials, and the like in the fields of civil engineering and construction, electrics and electronics, automobiles, railroads, ships, aircraft, sporting goods, arts and crafts, and the like, and can be especially effectively used particularly in electrical insulating materials, semiconductor sealing materials, adhesives for electronic components, aircraft structural members, satellite structural members, railroad car structural members, and the like of which castability, low thermal expansion properties, flame resistance, and a high degree of mechanical strength are required.

The invention claimed is:

1. A cyanate ester compound of a phenol-modified xylene formaldehyde resin, having a structure represented by the following general formula (I):

TABLE 1

| | | Example 2 | Example 4 | Comparative Example 1 | Comparative Example 2 |
|---|---|---|---|---|---|
| Blend (parts by weight) | NXDC | 100 | — | — | — |
| | GLPC | — | 100 | — | — |
| | Bisphenol A dicyanate | — | — | 100 | — |
| | Phenol novolac cyanate | — | — | — | 100 |
| | Zinc octylate | 0.05 | 0.05 | 0.05 | 0.05 |
| Monomer properties | MEK Solubility | >30% | >30% | >30% | >30% |
| Cured product properties | Tg (° C.: DMA) | 214 | 230 | 304 | 286 |
| | Dielectric constant (10 GHz) | 2.56 | 2.62 | 2.73 | 3.02 |
| | Dielectric loss tangent (10 GHz) | 0.007 | 0.008 | 0.011 | 0.015 |
| | Flame retardancy (UL94) | V-0 | V-1 | Burned completely | Burned completely |

[Formula 1]

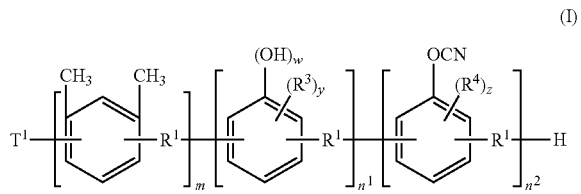

wherein
- $R^1$ each independently represents a methylene group, a methyleneoxy group, a methyleneoxymethylene group, or an oxymethylene group,
- $R^3$ to $R^4$ each independently represent a hydrogen atom, an alkyl group having 1 to 3 carbon atoms, a hydroxyl group, or a hydroxymethylene group,
- $T^1$ represents a hydrogen atom, a hydroxyl group, or a hydroxymethylene group,
- y and z each independently represent an integer of 0 to 3,
- w represents an integer of 0 or 1,
- m represents an integer of 0 or more,
- $n^1$ and $n^2$ each independently represent an integer of 1 or more, and
- when m represents 0, $R^3$ represents an alkyl group having 1 to 3 carbons, w represents 0, and y represents 2 or 3.

2. The cyanate compound according to claim 1, having a weight average molecular weight Mw of 250 to 10,000.

3. The cyanate compound according to claim 1, wherein the phenol-modified xylene formaldehyde resin is obtained by modifying a xylene formaldehyde resin using a phenol represented by the following general formula (1):

[Formula 2]

wherein Ar represents an aromatic ring, R represents all hydrogen atoms or monovalent substituents on the aromatic ring, the monovalent substituent is an alkyl group or an aryl group, and a plurality of Rs present on the aromatic ring may be the same or different, provided that at least one of Rs is a hydrogen atom.

4. The cyanate compound according to claim 3, wherein the phenol represented by the general formula (1) is phenol and/or 2,6-xylenol.

5. The cyanate compound according to claim 4, having a weight average molecular weight Mw of 250 to 10,000.

6. A method for producing the cyanate compound according to claim 1, comprising the steps of:
- phenol-modifying a xylene formaldehyde resin; and
- cyanating a phenolic hydroxyl group of an obtained phenol-modified xylene formaldehyde resin.

7. A curable resin composition comprising the cyanate compound according to claim 1.

8. The curable resin composition according to claim 7, further comprising at least one or more selected from the group consisting of a cyanate compound other than the cyanate compound obtained by cyanation of a phenol-modified xylene formaldehyde resin, an epoxy resin, an oxetane resin, and a compound having a polymerizable unsaturated group.

9. A cured product obtained by curing the curable resin composition according to claim 7.

10. A sealing material comprising the curable resin composition according to claim 7.

11. A fiber-reinforced composite material comprising the curable resin composition according to claim 7.

12. An adhesive comprising the curable resin composition according to claim 7.

13. A prepreg obtained by impregnating or coating a substrate with the curable resin composition according to claim 7, and drying the curable resin composition.

14. A laminate obtained by laminating metal foil on the prepreg according to claim 13, and hot-pressing the metal foil and the prepreg.

* * * * *

UNITED STATES PATENT AND TRADEMARK OFFICE
CERTIFICATE OF CORRECTION

PATENT NO. : 10,155,835 B2
APPLICATION NO. : 14/237426
DATED : December 18, 2018
INVENTOR(S) : Y. Sugano et al.

It is certified that error appears in the above-identified patent and that said Letters Patent is hereby corrected as shown below:

In the Claims

At Column 21, Line 19 (Claim 1, Line 11), please change "atom, a hydroxyl group, or" to -- atom or --.

Signed and Sealed this
Twenty-seventh Day of August, 2019

Andrei Iancu
*Director of the United States Patent and Trademark Office*